US008264215B1

(12) United States Patent
Kovach et al.

(10) Patent No.: US 8,264,215 B1
(45) Date of Patent: Sep. 11, 2012

(54) ONBOARD ELECTRICAL CURRENT SENSING SYSTEM

(75) Inventors: Daniel James Kovach, Renton, WA (US); Andrew M. Robb, Ravensdale, WA (US)

(73) Assignee: The Boeing Company, Chicago, IL (US)

( * ) Notice: Subject to any disclaimer, the term of this patent is extended or adjusted under 35 U.S.C. 154(b) by 390 days.

(21) Appl. No.: 12/635,576

(22) Filed: Dec. 10, 2009

(51) Int. Cl.
*G01R 31/02* (2006.01)

(52) U.S. Cl. ......... 324/72; 307/9.1; 307/11; 307/18; 307/19; 307/20; 307/24; 324/117 H; 324/117 R; 324/126; 324/555; 324/127; 324/128; 324/129; 324/72.5

(58) Field of Classification Search .......... 324/117 H, 324/117 R, 126, 72, 555, 127–129, 72.5; 307/9.1, 11, 18–20, 24
See application file for complete search history.

(56) References Cited

U.S. PATENT DOCUMENTS

| | | | |
|---|---|---|---|
| 4,105,966 A | 8/1978 | Lennon et al. | |
| 4,634,462 A * | 1/1987 | Fish et al. | 65/29.18 |
| 4,962,341 A * | 10/1990 | Schoeff | 326/43 |
| 5,011,821 A * | 4/1991 | McCullough | 505/166 |
| 5,266,926 A * | 11/1993 | Beigel | 340/572.1 |
| 5,774,065 A * | 6/1998 | Mabuchi et al. | 340/12.5 |
| 5,804,977 A * | 9/1998 | Consiglio | 324/678 |
| 6,175,808 B1 | 1/2001 | Chai | |
| 6,275,717 B1 * | 8/2001 | Gross et al. | 600/345 |
| 6,429,674 B1 * | 8/2002 | Barth et al. | 324/762.01 |
| 6,985,021 B1 * | 1/2006 | Zaliznyak et al. | 327/333 |
| 7,434,480 B2 | 10/2008 | Georgeson et al. | |
| 7,532,000 B2 * | 5/2009 | Kovach et al. | 324/117 H |
| 7,689,383 B2 * | 3/2010 | Black et al. | 702/183 |
| 7,829,796 B2 * | 11/2010 | Feider et al. | 174/261 |
| 7,883,050 B2 * | 2/2011 | Dufresne et al. | 244/1 A |
| 7,983,809 B2 * | 7/2011 | Kell et al. | 701/29.3 |
| 7,999,667 B2 * | 8/2011 | Carralero et al. | 340/531 |
| 2002/0089432 A1 * | 7/2002 | Staggs et al. | 340/945 |
| 2002/0154029 A1 * | 10/2002 | Watters et al. | 340/870.07 |
| 2003/0090356 A1 * | 5/2003 | Saito et al. | 336/213 |
| 2004/0172207 A1 * | 9/2004 | Hancock et al. | 702/60 |
| 2004/0178875 A1 * | 9/2004 | Saito | 336/200 |
| 2004/0246651 A1 * | 12/2004 | De La Fuente De Ana et al. | 361/215 |
| 2005/0030006 A1 * | 2/2005 | Leonard et al. | 324/158.1 |
| 2005/0080593 A1 * | 4/2005 | Blaser | 702/183 |
| 2005/0114090 A1 * | 5/2005 | Black et al. | 702/188 |

(Continued)

OTHER PUBLICATIONS

Alestra et al, "Developing an In-Flight Lightning Strike Damage Assessment System", TLE Workshop Jun. 2008, Conf Paper, 12 pgs.

(Continued)

*Primary Examiner* — Patrick Assouad
*Assistant Examiner* — Lamarr Brown
(74) *Attorney, Agent, or Firm* — Caven & Aghevli LLC (57) ABSTRACT

Electrical currents are detected and analyzed across structural members in a structural joint, such as a fastener of a vehicle. In some aspects, printed circuit boards etched with Rogowski coil circuits are inserted proximate the structural members in the structural joint. The Rogowski coil circuits may detect an electrical current as it flows through the structural joint. An integrator may integrate a transient current to generate an output signal, such as when the vehicle is subjected to an electrical charge. The output signal may be transmitted to an Integrated Vehicle Health Management (IVHM) system for analysis. In various aspects, the IVHM system may enable recording and reporting of various aspects of the current to enable maintenance, inspection, or real time/near real time health assessment of the vehicle.

18 Claims, 5 Drawing Sheets

U.S. PATENT DOCUMENTS

| | | | |
|---|---|---|---|
| 2005/0184899 A1* | 8/2005 | Witte et al. ............. 341/155 |
| 2005/0248454 A1* | 11/2005 | Hanson et al. .......... 340/539.26 |
| 2005/0253573 A1* | 11/2005 | Budillon et al. ............. 324/126 |
| 2006/0004499 A1* | 1/2006 | Trego et al. ............. 701/29 |
| 2006/0122734 A1* | 6/2006 | Coward ............. 700/282 |
| 2006/0220774 A1* | 10/2006 | Skendzic ............. 336/200 |
| 2006/0232265 A1* | 10/2006 | Fritsch et al. ............. 324/142 |
| 2006/0282705 A1* | 12/2006 | Lopez et al. ............. 714/27 |
| 2007/0115008 A1* | 5/2007 | Barth et al. ............. 324/713 |
| 2007/0124189 A1* | 5/2007 | Stoughton et al. ............. 705/8 |
| 2007/0298724 A1 | 12/2007 | Sulkowski, Jr. et al. |
| 2008/0036448 A1* | 2/2008 | Kovach et al. ............. 324/117 H |
| 2008/0039916 A1* | 2/2008 | Colliou et al. ............. 607/116 |
| 2008/0106254 A1* | 5/2008 | Kojovic ............. 324/127 |
| 2008/0122424 A1 | 5/2008 | Zhang et al. |
| 2008/0162070 A1* | 7/2008 | Yacobucci ............. 702/108 |
| 2008/0205479 A1* | 8/2008 | Tao et al. ............. 374/117 |
| 2009/0004480 A1* | 1/2009 | Dufresne et al. ............. 428/418 |
| 2009/0052832 A1* | 2/2009 | Roberts ............. 385/13 |
| 2009/0114427 A1* | 5/2009 | Feider et al. ............. 174/254 |
| 2009/0230948 A1* | 9/2009 | Kojovic ............. 324/117 R |
| 2009/0243590 A1* | 10/2009 | West et al. ............. 324/117 R |
| 2010/0005896 A1* | 1/2010 | Miller et al. ............. 73/779 |
| 2010/0020457 A1* | 1/2010 | Kojovic et al. ............. 361/93.2 |
| 2010/0042283 A1* | 2/2010 | Kell et al. ............. 701/29 |
| 2010/0052948 A1* | 3/2010 | Vian et al. ............. 340/963 |
| 2010/0057511 A1* | 3/2010 | Mansouri et al. ............. 705/7 |
| 2010/0233021 A1* | 9/2010 | Sliwa et al. ............. 422/20 |

OTHER PUBLICATIONS

Baum et al, "The Measurement of Lightning Environmental Parameters Related to Interaction with Electronic Systems", IEEE Trans on EMC, vol. EMC-24, No. 2, May 1982.

Ildas, "In-Flight Lightning Strike Damage Assessment System", retrieved Dec. 3, 2009, from http://ildas.nlr.nl/, 1 pgs.

* cited by examiner

Figure 5

ONBOARD ELECTRICAL CURRENT SENSING SYSTEM

TECHNICAL FIELD

The present disclosure pertains to sensing electrical currents, and more specifically, sensing electrical currents in an array of fasteners of a composite structural joint.

BACKGROUND

In some situations, various vehicles undergo testing as part of the overall development and/or certification process. For example, some aircraft may undergo a Low Level Pulse or Low Level Continuous Wave (LLP/LLCW) test during initial first article inspection and/or during routine maintenance and inspections. Under the LLP or LLCW test, a low level electrical current (generally fewer than 10 amps) is transmitted through various elements of the vehicle to evaluate current flow behavior through the vehicle. Changes in current flow behavior as exhibited during such tests are important indicators of the manner in which current may flow through such a vehicle during a lightning strike. Lightning strikes may affect structural elements, performance, and/or operation of installed electrical/electronic equipment and wiring. The LLP or LLCW tests may be used to verify the performance of a number of electromagnetic protection features. Examples of vehicles that may undergo LLP or LLCW testing include aircraft vehicles, maritime vessels, automobiles, and other large investment assemblies.

Although the LLP or LLCW tests may be extrapolated to understand the impacts of an actual high intensity electrical current pulse such as a lightning strike, further testing and/or maintenance may be required in the event of the vehicle receiving an actual lightning strike. For example, if lightning were to strike a composite based structure, the current is likely to flow from the higher impedance composite structures through lower impedance conductive metal structures (e.g., through metallic fasteners). In such an event, the fasteners that act as intermediary electrical connections between the composite and metal elements may be in need of inspection. Since it may be difficult to see visual evidence of the magnitude of such transient current flows, systems and methods are needed to understand the effects on electrical currents on structures and fasteners.

SUMMARY

Methods and systems to detect, measure, and/or analyze electrical currents are disclosed. In one embodiment, a current is received through a structural joint. A plurality of Rogowski coil circuits of the structural joint detect the current. The current is integrated to generate an output signal. The output signal is transmitted to an Integrated Vehicle Health Management (IVHM) system for analysis. Details of the current flow including a current pulse, a Total Charge (Q), a maximum rate-of-change (dI/dt) of the current pulse, an Action Integral of the current pulse (in Amps-squared-seconds), an event time for the pulse (for event synchronization purposes) and/or a tag identifying the coil circuit detecting the current pulse are recorded to a log.

In another embodiment, an onboard electrical sensing system includes a sensor to detect a flow of current on fasteners and other structures such as fuel tubes, hydraulic lines, cables, etc. . . . and acquire various data associated with the flow. An integrator integrates the data associated with the flow to an analog signal. An analog-to-digital converter converts the analog signal to a digital signal. An Integrated Vehicle Health Management (IVHM) system receives the data acquired (magnitude of the current pulse, total charge, maximum rate-of-change (dI/dt) of the current pulse, Action Integral of the current pulse (in Amps-squared-seconds), event time for the pulse (for event synchronization purposes) and/or a tag identifying the sensor capturing the current pulse).

In another embodiment, an Integrated Vehicle Health Management (IVHM) system includes an analysis module to analyze a transient electrical current detected by an uncored transformer positioned between two structures. The analysis module may analyze the transient electrical current flow to determine information about the transient electrical current pulse (e.g., magnitude, flow direction, effect of flow on structure and/or systems). A communications module provides relevant information to flight crews and maintenance personnel gleaned from the sensing and analysis of the transient electrical current. A database interface module stores data associated with the electrical current to a data log.

The features, functions, and advantages may be independently achievable in various embodiments of the present disclosure or combinable in yet other embodiments.

BRIEF DESCRIPTION OF THE DRAWINGS

The detailed description is described with reference to the accompanying Figures. In the Figures, the left-most digit(s) of a reference number identifies the Figure in which the reference number first appears. The same reference numbers in different Figures indicate similar or identical items.

DETAILED DESCRIPTION

Overview

An onboard electrical sensing system may advantageously detect an electrical current in real time or near real time. When implemented on a composite based aircraft, electrical sensors may be inserted between a composite skin layer and a structural framework to detect an electrical current as it flows through multiple low impedance conductive metal structures that join the skin to the framework. The electrical sensors enable detection of a wide range of currents from a Low Level Continuous Wave test (e.g., an electrical current less than 10 amps used to simulate lightning) and a high level lightning strike (e.g., as high as 200 kilo-amps) by using a gain control system such as a switched attenuator and/or amplifier. The detected signal current may be transmitted to an onboard Integrated Health Management (IVHM) system for analysis.

The IVHM system may analyze the current to monitor an overall health of the aircraft by determining a magnitude, flow direction, and/or effect of the current on the aircraft or subsystems of the aircraft. In some instances, the IVHM system may indicate specific structural members of the aircraft that were exposed to the current by labeling the exposed structural members tag identifiers. Detection and analysis of the current flow may be beneficial for scheduling or performing aircraft maintenance or for other purposes. For example, the IVHM system may record, via a log, the magnitude and affected locations of the strike (or in some cases which fasteners are exposed to the current) so that maintenance personnel can identify which fasteners or structural components of the aircraft should be inspected, replaced, and/or repaired. As such, the IVHM system may provide for the employment of Condition-Based Maintenance (CBM) strategies that could allow for reduction of onerous inspections and/or maintenance of the aircraft.

The IVHM system may determine data associated with the electrical current including a magnitude of the current, a total charge, a maximum rate-of-change (dI/dt) of the current, an Action Integral of the current (in Amps-squared-seconds), an event time for the current (for event synchronization purposes) and/or identifying the sensor capturing the current via a tag identifier. The IVHM system may then communicate one or more elements of the data to relevant parties. For example, if a magnitude of the electrical current indicates that the aircraft was struck by lightning, the IVHM system may make an announcement through an Engine Indication and Crew Alerting System (EICAS) to a pilot that the aircraft was struck by lightning. Absent such analysis, a pilot would have to witness an actual lightning strike in order to know that the aircraft was struck by lightning, and even then it is unlikely to know an exact location of the strike without further inspection. Absent such a system it is also very difficult to even estimate the relative magnitude of the strike. For example, if the current sensors detect large power frequency (400 Hz) currents flowing in structure, the system could determine that the source is a fault to ground on the power system and execute a preprogrammed response to such a fault.

Although the methods and systems described herein are illustrated using an aircraft in exemplary embodiments, it should be appreciated that the methods and systems described herein may be applied to a variety of structures with composite surfaces such as mobile objects (e.g., automobiles, maritime vessels, helicopters, spacecraft, trains, etc.) and non-mobile objects (e.g., communication antennas, buildings, windmills, electrical boxes, etc.).

Illustrative Embodiment

Figure 1:
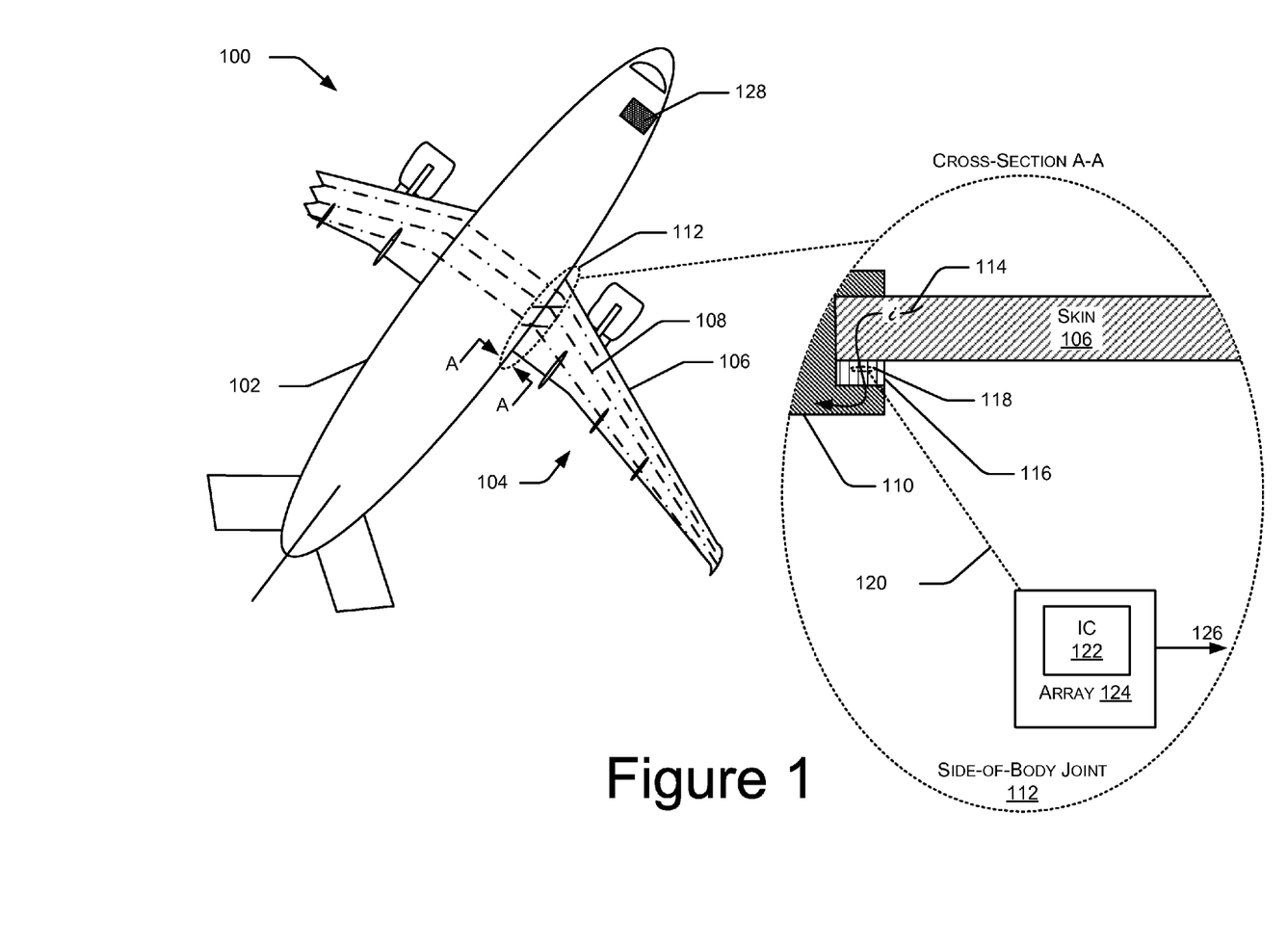
FIG. 1 is an illustrative aircraft including an onboard electrical sensing system.

FIG. 1 illustrates an aircraft 100 in accordance with an embodiment of the present invention. The aircraft 100 may include a fuselage 102 and a composite wing structure 104 that is coupled to the fuselage. In some embodiments, composite wing structure 104 may be a single panel spanning from wingtip to wingtip. Alternatively, the composite wing structure 104 may include multiple wing panels. A plurality of structural members 108 (e.g., beams, stringers, spars, and ribs) may be used to form a skeletal structure (such as a framework) and may be overlaid with a composite material skin 106 to form the composite wing structure 104. The structural members 108 may be formed from metal (e.g. aluminum, titanium and so forth) and/or composite materials (e.g., carbon fiber, graphite, and the like). For example, in some embodiments, the structural members 108 may be a beam 110 of a side-of-body joint 112.

In the event that the aircraft 100 is subjected to an electrical current 114 such as when the aircraft is struck by lightning or when the aircraft is undergoing a Low Level Continuous Wave (LLCW) test, the electrical current is likely to disperse into the skin 106 from which a portion will flow through the beam 110. Depending on a magnitude of the electrical current 114, the currents may not only flow through a closest beam, such as a beam which is directly struck by lightning, rather the current may also flow through any adjacent beams. It should be appreciated that the electrical current 114 may not be limited to flowing through beams of a structural joint. Rather, the electrical current 114 may induce through electromagnetic coupling additional flows through other low impedance platform components such a wire bundle and/or an avionics system.

In order to detect a magnitude and flow path of the electrical current 114 through the low impedance platform components of an aircraft, such as the side-of-body joint 112 of aircraft 100, a printed circuit board (PCB) 116 etched with a Rogowski coil circuit 118 may be inserted around the low impedance platform component. For example, the PCB 116 etched with the Rogowski coil circuit 118 may be inserted between the composite material skin 106 and the beam 110 to detect the electrical current 114 as it flows through the beam. In some embodiments, the Rogowski coil circuit 118 may detect the electrical current 114 flowing through the beam 110 as a transient current 120 (i.e., induced current vs. time). The PCB 116 may output the transient current 120 to an integrator circuit 122 of a passive or active integrator array 124. The integrator circuit 122 may detect and integrate the transient current 120 into an output 126 for communication to an Integrated Health Management (IVHM) system 128. In some embodiments, various details of the transient current 120 are detected including a pulse, a total charge, a maximum rate-of-change (dI/dt) of the current pulse, an Action Integral of the current pulse (in Amps-squared-seconds), an event time for the pulse (for event synchronization purposes) and/or a tag identifying the coil circuit capturing the current pulse.

The IVHM system 128 may employ model-based reasoning to monitor an overall health of the aircraft 100 by analyzing, storing, and/or communicating data pertaining to the transient current 120. In some embodiments, the IVHM system 128 analyzes the transient current 120 to determine a magnitude, flow path of the electrical current 114, and/or effects of the flow path on various structures and/or systems of the aircraft 100. In some embodiments, the IVHM system 128 may also identify specific structural members that the electrical current passed through after an electrical event (e.g., a lightning strike or current test). Knowledge of which specific structural members were exposed to the electrical current 114 (and the magnitude or time-history of the current) may be desirable for aircraft maintenance or for other reasons. For example, the IVHM system 128 may communicate the exposed structural members to maintenance personnel, by way of a report or log, so that maintenance personal are informed as to which structural components of the aircraft 100 desire may need inspection, replacement and/or repair. In some embodiments, the log may include details of the current flow such as a magnitude of the current pulse, a total charge, a maximum rate-of-change (dI/dt) of the current pulse, an Action Integral of the current pulse (in Amps-squared-seconds), an event time for the pulse (for event synchronization purposes) and/or a tag identifying the coil circuit capturing the current pulse.

In some embodiments, the IVHM system 128 may analyze the output 126 to communicate a magnitude, source, direction, and/or effect of the current. For example, if a magnitude of the electrical current 114 indicates that the aircraft 100 was struck by lightning, the IVHM system 128 may communicate a voice or textual message to a pilot with relevant information based on the nature of the lightning strike and its propagation through the aircraft. In some embodiments, the IVHM system 128 may identify a specific structural member of the aircraft that was struck by the lightning. It should be appreciated that the PCB may be etched with multiple Rogowski coil circuits to simultaneously measure the electrical current as it flows through multiple structural members of the aircraft. In addition, it should be appreciated that multiple PCBs may be dispersed through various portions of the aircraft 100 to capture the electrical current 114 as it flows throughout the entire aircraft.

Figure 2:
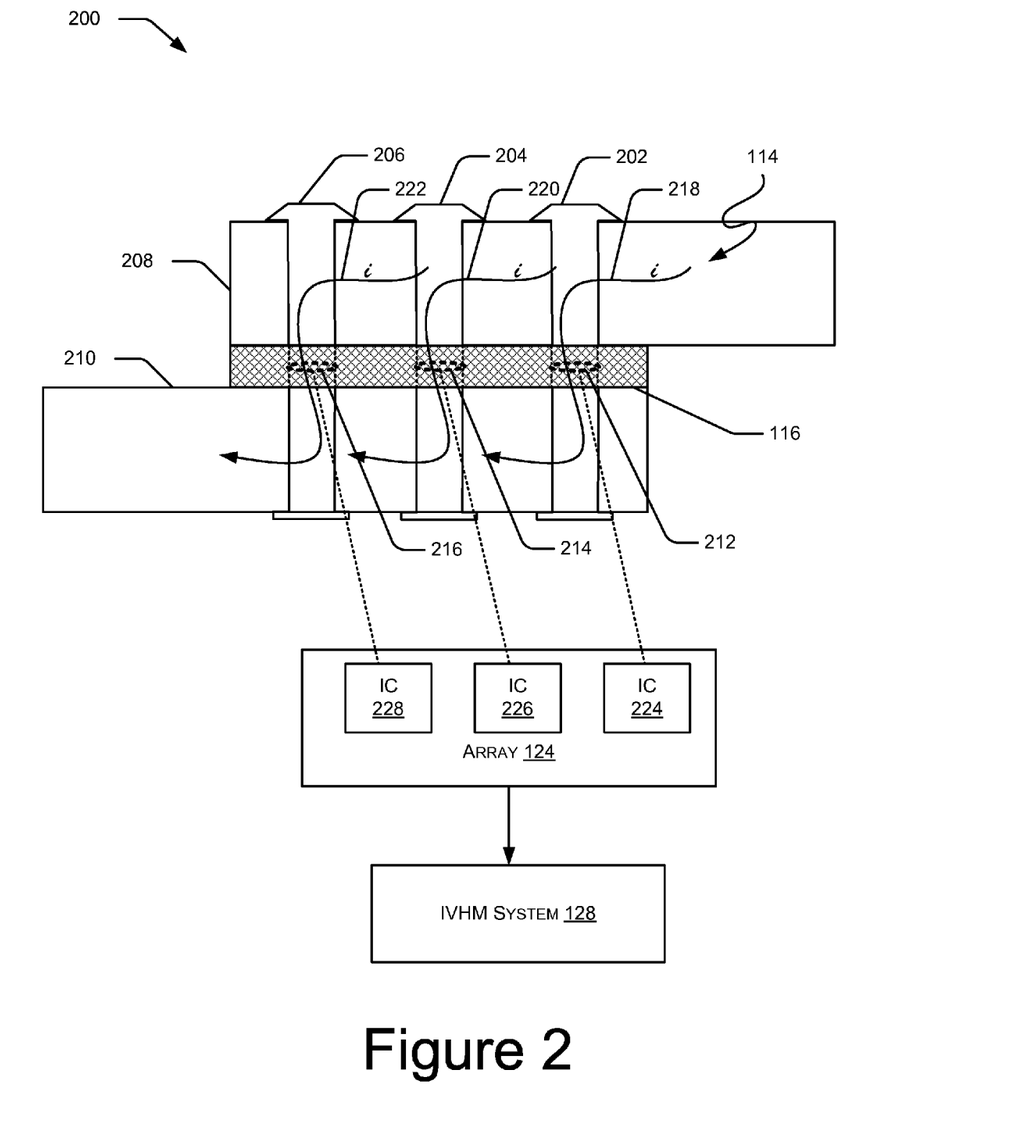
FIG. 2 illustrates an illustrative electrical sensing system implemented across multiple fasteners of a structural joint.

FIG. 2 illustrates a structural joint 200 having multiple fasteners 202, 204, and 206 to join together two structures 208, 210 in accordance with an embodiment of the present invention. The structural joint 200 may be the side-of-body joint 112 joining together the composite material skin 106 and the beam 110 illustrated in FIG. 1. The PCB 116 may be inserted between the two structures 208, 210. The PCB 116 may be etched with multiple Rogowski coil circuits 212, 214, and 216 positioned around each of the multiple fasteners 202, 204, and 206, respectively. In the event that the structural joint 200 is subjected to an electrical current 114, the electrical current may disperse into the multiple fasteners 202, 204, and 206 as unique split currents 218, 220, and 222, respectively. Each of the multiple Rogowski coil circuits 212, 214, and 216 may detect each of the unique current streams 218, 220, and 222 flowing through each of the multiple fasteners 202, 204, and 206, respectively. For example, Rogowski coil circuit 212 may detect the induced current 218 flowing through the fastener 202, and so forth.

The PCB 116 may output the induced currents 218, 220, and 222 to respective individual integrator circuits 224, 226, and 228 of the passive integrator array 124. For example, the PCB 116 may output induced current 218 to integrator circuit 224, and so forth. Each integrator circuit 224, 226, and 228 may integrate the respective induced current 218, 220, and 222 into an array output for communication to the IVHM system 128. It should be appreciated that multiple PCBs may be dispersed through various portions of a structure or vehicle to capture a flow of current throughout the entire structure or vehicle.

Although FIG. 2 illustrates three Rogowski coil circuits 212, 214, and 216, the number of Rogowski coil circuits may be more or less than three. In addition, the number of fasteners does not have to align with the number of Rogowski coil circuits.

Illustrative Electrical Flow Sensing System

Figure 3:
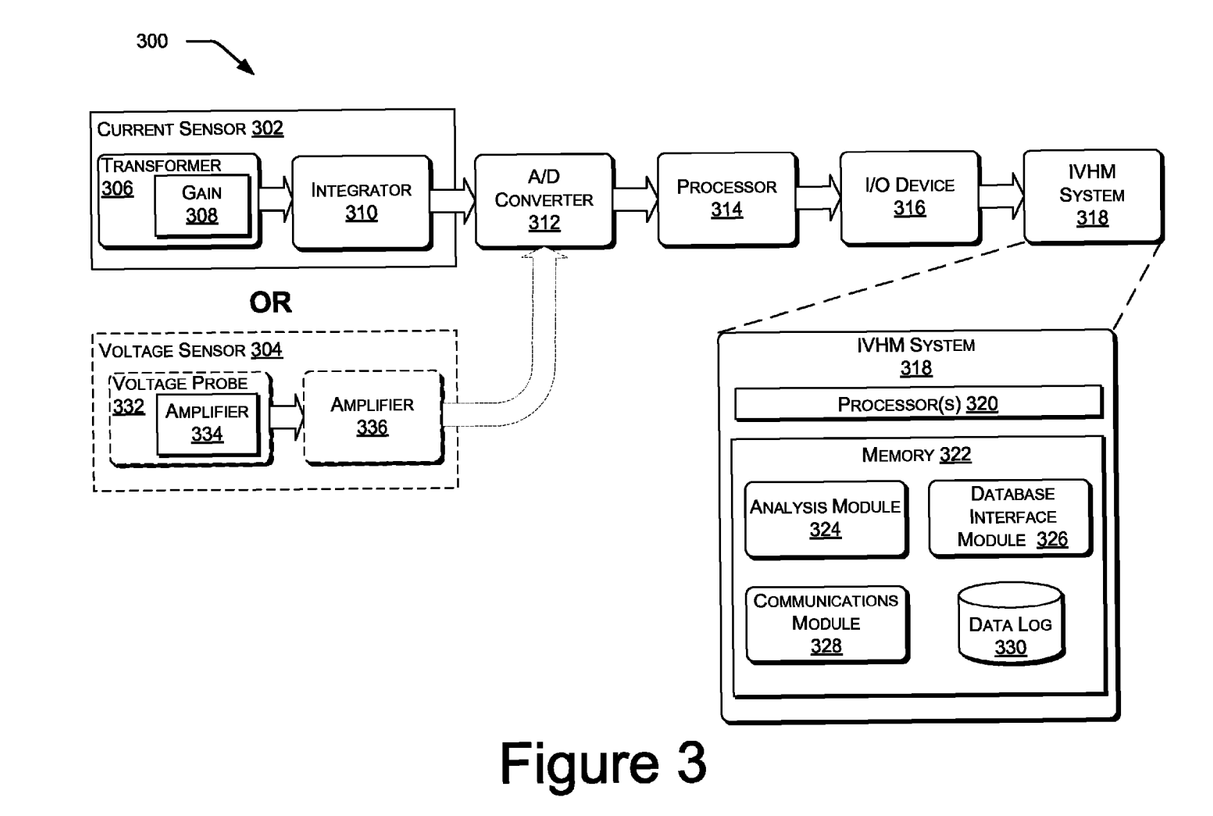
FIG. 3 is an illustrative electrical flow sensing system.

FIG. 3 is an illustrative electrical flow sensing system 300. The electrical flow sensing system 300 may detect, measure, and/or analyze electricity as it flows through a structure. In some embodiments, the electrical flow sensing system 300 uses a current sensor 302 to detect the electrical flow as a an electrical current. Alternatively, as also illustrated in FIG. 3, the electrical flow sensing system 300 uses a voltage sensor 304 to detect the current flow by the induced electrical potential. Regardless of whether the system 300 uses the current sensor 302 or the voltage sensor 304, the system 300 may detect the electrical flow as it passes through a structural joint such as the side-of-body joint 112 of aircraft 100.

In various embodiments, an uncored transformer 306 detects the electrical current 114 as the transient current 120. In accordance with some embodiments, the uncored transformer 306 may be a printed circuit board (PCB) 116 etched with a Rogowski coil circuit 118 such as illustrated in FIG. 1. Alternatively, the uncored transformer 306 may be a PCB 116 etched with multiple Rogowski coil circuits (e.g., the Rogowski coil circuits 212, 214, and 216 as illustrated in FIG. 2). In some embodiments, the uncored transformer 306 is able to detect a wide range of electrical currents. For example, the uncored transformer may detect electrical currents approximately ranging from 200 mA to 200 kA. In order to detect electrical currents ranging from a low magnitude to a high magnitude, the uncored transformer 306 may include a gain control system 308 such as a switched attenuator and/or amplifier to either attenuate or amplify the electrical current. For example, if an aircraft is undergoing a Low Level Continuous Wave (LLCW) test (i.e. an electrical current less than 10 amps transmitted through the aircraft), then the gain control system 308 may trigger a switch to amplify the electrical current. Alternatively, if the system is in an operation status such as in-flight, the gain control system 308 may trigger a switch to attenuate the signal rather than amplifying the magnitude of the electrical current.

In some embodiments, the gain control system may automatically determine whether to amplify the electrical current. For example, if a magnitude of the electrical current is below a threshold value, the gain control system may amplify the magnitude of the electrical current. However, if the system 300 is struck by lightning (i.e., an electrical current which may generate 300,000 amps of electricity), then the gain control system may recognize the electrical current as being above a threshold value and thus measure the electrical current as is without amplifying the electrical current.

The uncored transformer 306 may output the transient current signal to an integrator 310. The integrator 310 may be an active or passive integrator to integrate the transient current 120 as an analog signal. In some embodiments, the integrator 310 may include a filter to filter a noise of the transient current 120. In some embodiments, the transformer 306 and the integrator 310 may be separate pieces of hardware. Alternatively, the transformer 306 and the integrator 310 may be included on the same piece of hardware. As shown in FIG. 3, the current sensor 302 may comprise the transformer 306 and the integrator 310.

An analog to digital (A/D) converter 312 may convert the analog signal to a digital signal. The A/D converter 312 may output the digital signal to a processor 314 or a microcontroller for analysis and processing. For example, the processor 314 may input the digital signal, timestamp it and compare it to a characteristic performance curve. In accordance with some embodiments, the characteristic performance curve may be generated by a LLCW test using embodiments of the electrical current sensing system described herein. If the digital signal is above the characteristic performance curve, the processor 314 may output a data packet across an Input/Output (I/O) device 316 to an IVHM system 318. In an alternative embodiment, the processor 314 may output the data packet across the I/O device 316 to the IVHM system 318 regardless of whether the digital signal is above the characteristic performance curve. The data packet may contain data pertaining to variables of the electrical current such as a magnitude of the current pulse, a total charge, a maximum rate-of-change (dI/dt) of the current pulse, an Action Integral of the current pulse (in Amps-squared-seconds), an event time for the pulse (for event synchronization purposes) and/or a tag identifying the sensor capturing the current pulse. The I/O device 316 may be a wired communication medium such as serial communication (e.g., RS232 or RS485), Ethernet, Canbus; or the IVHM I/O device may be a wireless communication medium such as Zigbee, Bluetooth, 802.11, etc.

The IVHM system 318 may be a computing device to manage an overall health of the structure. In some embodiments, the IVHM system 318 may include one or more processors 320 and system memory 322. System memory 322 may be volatile (such as RAM), non-volatile (such as ROM, flash memory, etc.) or some combination of the two. System memory 322 may include an analysis module 324, a database interface module 326, a communications module 328 and a data log 330, each described in turn.

The analysis module 324 may analyze various elements of the electrical current such as a magnitude, time-history, flow direction, effect of the flow, and/or location of the electrical current to manage the overall health of the structure. For example, the analysis module 324 may analyze the electrical current to determine an effect of the electrical current one the overall structure of subsystems of the structure. In accordance with some embodiments, the analysis module 324 may perform a more in-depth analysis as compared to the processor 314. For example, the analysis module 324 may analyze an electrical current input from multiple sensors rather than analyzing the electrical current from a single sensor. By combining multiple sensors data the IVHM system could determine the source and amplitude of the transient current (such as where the lightning hit and how powerful a hit it was). The system could also determine the path the electrical currents took as it flowed along and through the vehicle structure. This could be used to compute possible areas for damage inspections to be concentrated on or could be used to determine what structural, hydraulic, fuel, or electrical systems should undergo conditional based maintenance.

The database interface module 326 may store the magnitude, time-history, flow direction, effect of the flow, and/or location of the electrical current to the data log 330. In some embodiments, the database interface module 326 may store results of the analysis performed by the analysis module 324. The data log 330 may then be used by maintenance personnel such as ground crew in preparation for or during maintenance and/or repair of the structure. For example, if the data log 330 contains information indicating that a specific structural member was damaged during the flow of the electrical current, the ground crew may use this information to replace only the damaged structural member.

The communications module 328 may report an output based on the electrical current. It should be appreciated that the output may be a verbal or a non-verbal communication. For example, the communications module 328 may output a voice signal through an Engine Indication and Crew Alerting System (EICAS) of an aircraft indicating that the aircraft was struck by lightning. In some embodiments, the output may also indicate a location of the lightning strike on the aircraft or other platform.

Although transformer 306 illustrates sensing an electrical current, it should be appreciated that the electrical flow sensing system 300 may use a voltage sensor 304 rather than the current sensor 302 to detect the electrical flow. When using the voltage sensor 304, the system 300 may use the A/D converter 312 and the processor 314 as described above. In some embodiments, the voltage sensor 304 detects a voltage using a voltage probe 332 and a control gain such as an amplifier 336 in place of the transformer 306 and the integrator 310. The voltage probe 332 may be a set of leads connected to the structure to detect an electrical flow as a voltage. The voltage probe 332 may be capable of detecting electricity in an approximate range of 50 Volts to 5,000 Volts.

In order to detect electrical volts ranging from a low magnitude to a high magnitude, the voltage probe 332 may include a switch connected to an amplifier 334 to amplify a voltage when an unamplified magnitude of the electricity is below a threshold value.

The voltage probe 332 may output the voltage to the amplifier 336 for further processing. The A/D converter 312 may convert the analog signal from the amplifier 336 to a digital form in a similar manner to the A/D converter converting the analog signal from the integrator 310 to digital form.

Although the discussion thus far has focused on sensing electrical current flow through an aircraft, it should be appreciated that the system 300 may be used to detect electrical flow through any structure that may incur an electrical event such as a lightning strike. System 300 may be used in conjunction with mobile platforms (e.g., automobiles, maritime vessels, helicopters, spacecraft, trains, and so forth . . . ) as well as non-mobile platforms (e.g., buildings, towers, windmills, facilities, and so forth . . . ). For example, system 300 may be implemented on spacecraft to detect, measure, and/or analyze electrostatic discharges (ESD). An ESD is an event on a spacecraft that has the potential of upsetting or damaging on-board electrical systems. Embodiments of the system 300 described herein may detect an onset of ESD by detecting transient current flow in the spacecraft. Once the system 300 detects the onset of ESD, system may desirably trigger a timely shut down (or safe mode) of the on-board electrical systems to protect susceptible electrical systems from more severe charging environments which may follow the detected onset of the ESD. In addition, the system 300 may also be used to detect electrical currents induced on structures from the Electromagnetic Pulse (EMP) due a nuclear weapon detonation, or the EMP from a specialized EMP weapon.

Illustrative Sensing Device

Figure 4:
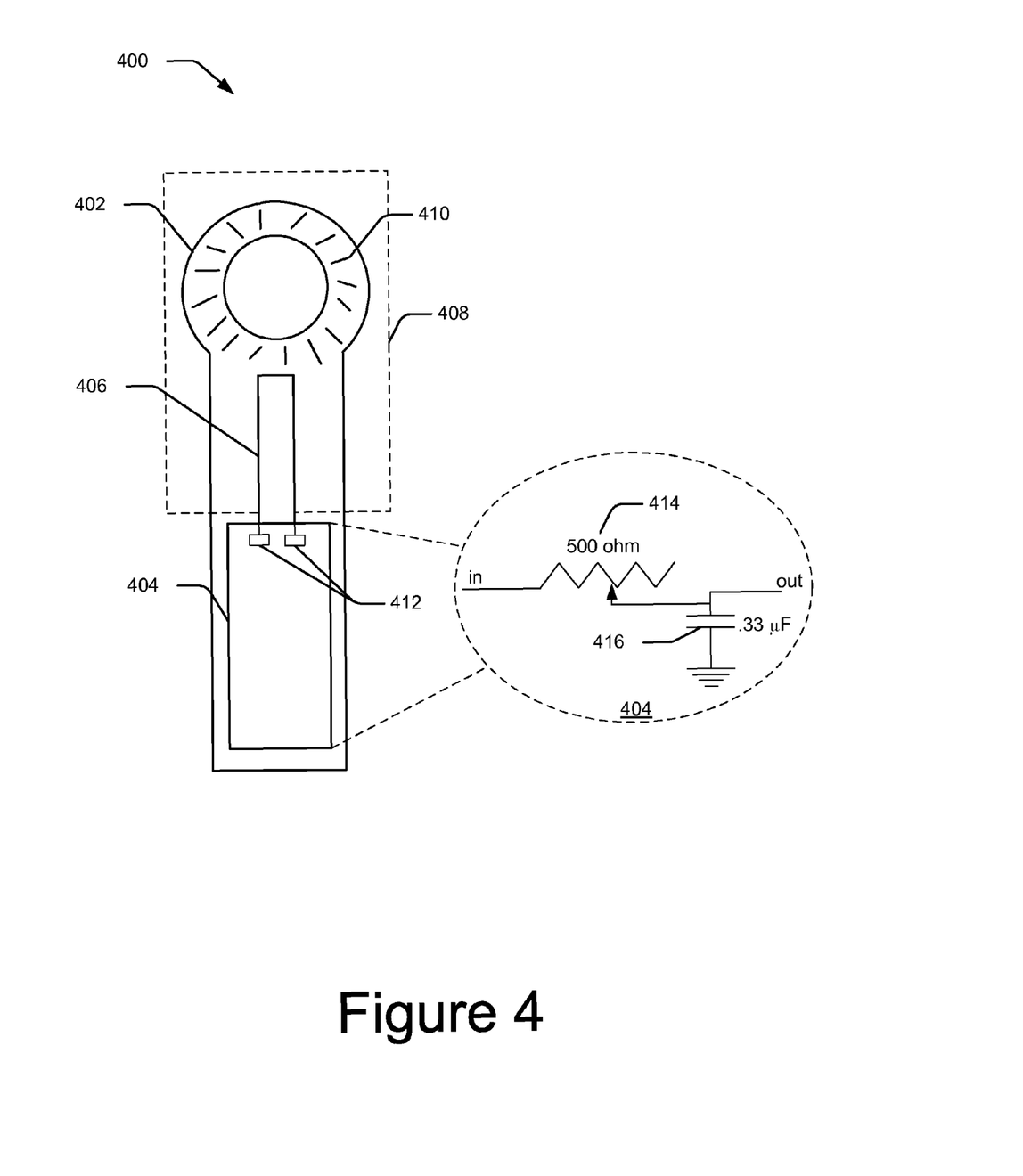
FIG. 4 is an illustrative sensing device.

FIG. 4 is an illustrative sensing device 400 that includes a Rogowski coil 402 and an embedded integrator 404. As noted above, the transformer 306 and the integrator 310 may be included on the same piece of hardware. The sensing device 400 may be used in accordance with embodiments of the disclosure. For example, sensing device 400 may be inserted between two structures to measure an electrical current as it flows between the two structures 208, 210 as shown in FIG. 2.

Sensing device 400 may include a trace pattern 406 for every Rogowski coil 402. Together, the Rogowski coil 402 and the trace pattern 406 form a Rogowski coil sensory circuit 408. The Rogowski coil sensory circuit 408 may surround a fastener of a structural joint to detect an electrical current passing through the fastener as illustrated in FIG. 1. In accordance with some embodiments, the trace pattern 406 may be designed using a standard PC-board Electronics Computer Aided Design (ECAD) package.

The trace pattern 406 may include wires 410 which are wound in nearly-concentric but opposing directions. In some embodiments, the wires 410 are wound so that a signal response of the Rogowski coil sensory circuit 408 to the structure under measurement is maximized while a response to magnetic fields external to the Rogowski coil sensory circuit is minimized. For example, the wires 410 may be wound in a double helix pattern where a first helix encircles a fastener in a clockwise direction, and a second helix encircles the fastener in a counterclockwise direction. The two helixes may be connected to each other at one end to form a continuous coil, and the other ends of the two helixes are connected to an input lead 412 to the integrator 310.

The Rogowski coil sensory circuit 408 may detect an electrical current as a transient current and output the transient current to integrator 404. In accordance with some embodiments, integrator 404 may include a 500 ohm variable resistor 414 and a 0.33 µF capacitor 416 to filter the noise emanating from electromagnetic interference. The integrator 310 may integrate the transient current from the Rogowski coil sensory circuit 408 for output to an IVHM system 318.

Illustrative Process

Figure 5:
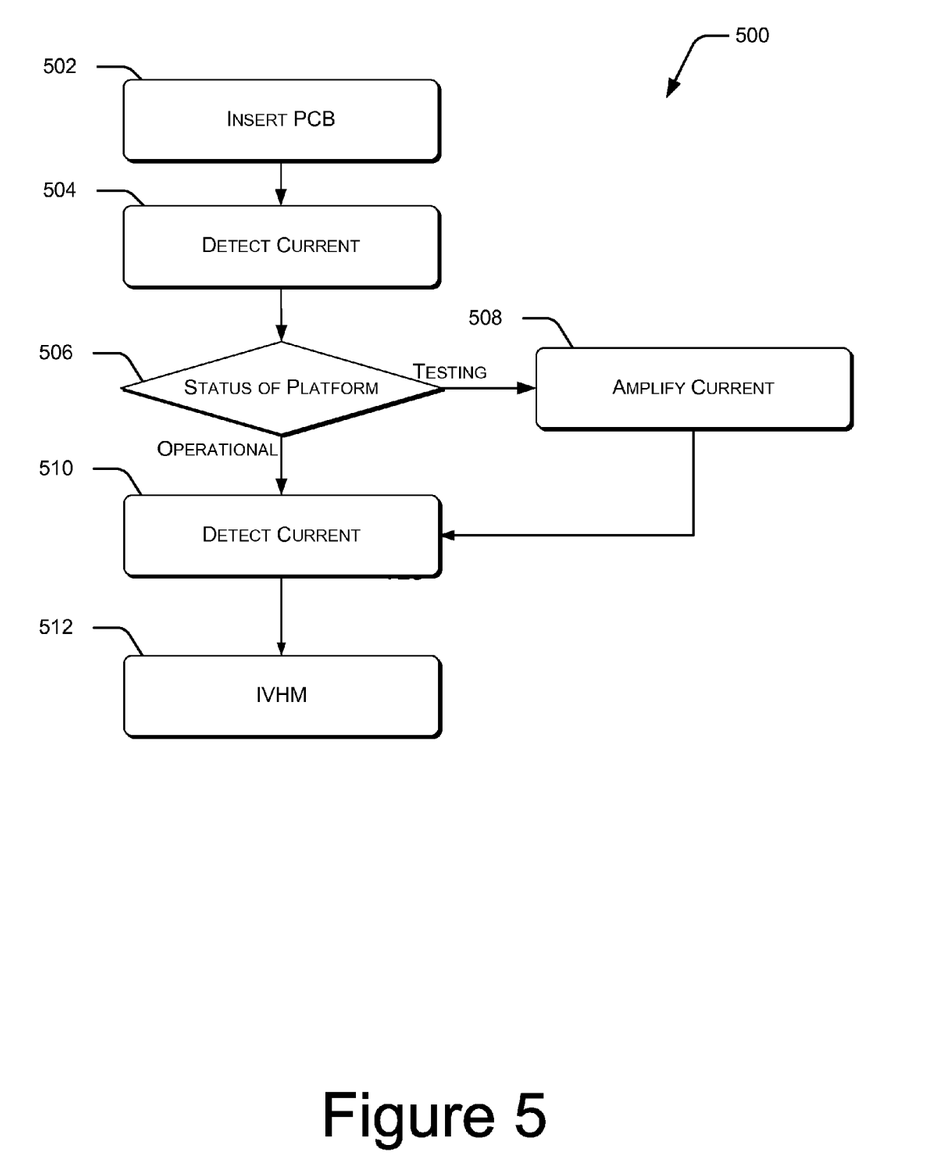
FIG. 5 is a flow diagram of an illustrative process of sensing an electrical current.

FIG. 5 is a flow diagram of an illustrative process 500 of sensing an electric current in accordance with embodiments of the disclosure. The process 500 is illustrated as a collection of blocks in a logical flow graph, which represents a sequence of operations that can be implemented in hardware, software, or a combination thereof. In the context of software, the blocks represent computer-executable instructions that, when executed by one or more processors, cause the one or more processors to perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the process. The process 500 will be discussed with reference to the elements of FIG. 1 and FIG. 2.

At 502, a multiple Rogowski coil circuits 212, 214, and 216 are inserted around multiple fasteners 202, 204, and 206 to detect a current as it flows through the multiple fasteners. In accordance with some embodiments, the multiple fasteners 202, 204, and 206 are part of a structural joint such as side-of-body joint 112 of FIG. 1. In some embodiments, the multiple Rogowski coil circuits 212, 214, and 216 are etched on one or more PCBs 116 to detect current as it flows through the multiple fasteners 202, 204, and 206.

It should be appreciated that the process 500 may not be limited to inserting multiple Rogowski coil circuits 212, 214, and 216 around multiple fasteners 202, 204, and 206 at 502. Rather, the multiple Rogowski coil circuits 212, 214, and 216 may be inserted around any low impedance platform component such as a structural joint, a wire bundle, and/or an avionics system at 502. In addition, the PCB 116 may be etched with a single Rogowski coil circuit 118 and inserted around a single fastener at 502 rather than being etched with multiple Rogowski coil circuits 212, 214, and 216 and inserted around multiple fasteners 202, 204, and 206 at 502.

At 504, the multiple Rogowski coil circuits 212, 214, and 216 may detect a current 218, 220, and 222 flowing through the multiple fasteners 202, 204, and 206. In accordance with some embodiments, each Rogowski coil circuit of the multiple Rogowski coil circuits 212, 214, and 216 may detect a unique current flowing through each of the multiple fasteners 202, 204, and 206. In some embodiments, the multiple Rogowski coil circuits 212, 214, and 216 may detect the current as a transient current 120 at 504.

At 506, the transformer 306 may determine a status of the platform. If the platform is in a testing mode (e.g. the "testing" branch at 506), then process 500 continues to block 508. If the platform is in an operational mode (e.g. the "operational" branch at 506), then process 500 continues to block 510.

At 508, the transformer 306 amplifies the current 120 to a higher level. In embodiments where the multiple Rogowski coil circuits 212, 214, and 216 is etched onto the PCB 116, the PCB may include a gain control system such as a switched attenuator and/or amplifier to amplify the current at 508. After the current is amplifies at 508, process 500 continues to 510.

At 510, multiple integrator circuits 224, 226, and 228 of a passive integrator array 124 may integrate the current into an array output 126. For example, each of the multiple integrator circuits 224, 226, and 228 may correspond to a unique fastener 202, 204, and 206 respectively such that each integrator circuit integrates a current output from an individual fastener at 510.

At 512, an I/O device 316 transmits the array output 126 to the IVHM system 318 for analysis. In some embodiments, the IVHM system 318 analyzes the array output 126 at 512 to determine a magnitude of the electrical current at each fastener as well as a general flow path of the electrical current. In some embodiments, the IVHM system 318 may output a source and/or magnitude of the electrical current at 512.

CONCLUSION

While embodiments of the disclosure have been illustrated and described, as noted above, many changes can be made without departing from the spirit and scope of the disclosure. Accordingly, the scope of the disclosure is not limited by the disclosure of these embodiments. Instead, the disclosure should be determined entirely by reference to the claims that follow.

What is claimed is:

1. A method of sensing an onboard electrical current, the method comprising:
   receiving a current through one or more structural members of a structural joint;
   detecting the current via a plurality of Rogowski coil circuits of the structural joint;
   integrating the current from the plurality of Rogowski coil circuits into an output signal;
   transmitting the output signal to an Integrated Vehicle Health Management (IVHM) system; and
   recording, via the IVHM system, a log of the current including a magnitude of the current and a tag identifying a coil circuit detecting the current; and
   inserting at least one printed circuit board etched with the plurality of Rogowski coil circuits into the structural joint.

2. The method of claim 1, wherein the structural joint joins two elements of an aircraft, wherein at least one of the two elements is a composite structure.

3. The method of claim 1, wherein the current is received from at least one of a lightning strike or an aircraft certification test.

4. The method of claim 1, further comprising:
   comparing the output signal from the plurality of Rogowski coil circuits to a characteristic performance curve to determine a severity of the current; and
   outputting the severity of the current as one of an audible or textual message.

5. The method of claim 1, wherein the printed circuit board includes a gain control system to either amplify or attenuate a magnitude of the current.

6. An onboard current sensing system, comprising:
   an electrical sensor to detect a flow of electrical currents;
   an integrator to integrate the flow of electrical currents to an analog signal;
   an analog-to-digital converter to convert the analog signal to a digital signal; and
   an Integrated Vehicle Health Management (IVHM) system to receive the digital signal and record a log of attributes of the flow of electrical currents including a magnitude of the electrical currents and a tag identifying a source of the electrical currents, wherein the electrical sensor is a Rogowski coil circuit capable of measuring a current of the flow of electrical currents in a range from 200 mA to 200 kA.

7. The electricity sensing system of claim 6, wherein the electrical sensor is a voltage probe capable of measuring a voltage of the flow of electrical currents in a range from 50 volts to 5000 volts.

8. The electricity sensing system of claim 6, wherein the integrator is embedded on the Rogowski coil circuit.

9. The electricity sensing system of claim 6, wherein the electrical sensor is positioned between two structures of an aircraft, wherein at least one of the two structures is a composite structure.

10. The electricity sensing system of claim 9, wherein the electrical sensor includes a gain control system to: (1) amplify a magnitude of the electrical currents when the aircraft is in a testing status, and (2) attenuate the electrical currents when the aircraft is in an operational status.

11. The electricity sensing system of claim 6, wherein the IVHM system further compares the digital signal to a characteristic performance curve to determine a severity of the electrical currents.

12. The electricity sensing system of claim 11, wherein the electrical sensor generates the characteristic performance curve.

13. The electricity sensing system of claim 6, wherein the electrical sensor detects the flow of electrical currents as a transient current.

14. An Integrated Vehicle Health Management (IVHM) system, comprising:
- an uncored transformer positioned between two structures to detect an electrical current, wherein the uncored transformer comprises a Rogowski coil circuit capable of measuring a current of the flow of electrical currents in a range from 200 mA to 200 kA;
- an analysis module to determine a magnitude and flow direction of the electrical current;
- a communications module to output the magnitude and flow direction of the electrical current; and
- a database interface module to store data associated with the electrical current, the data stored in a data log.

15. The IVHM system of claim 14, wherein the analysis module compares the electrical current to a characteristic performance curve to determine a severity of the current.

16. The IVHM system of claim 15, wherein the uncored transformer generates the characteristic performance curve.

17. The IVHM system of claim 14, wherein at least one of the two structures is a composite structure of an aircraft.

18. The IVHM system of claim 14, wherein the database interface module stores the magnitude and flow direction of the electrical current and a structural location of one or more areas affected by the electrical current in the data log.

* * * * *